(12) United States Patent
Varjos

(10) Patent No.: US 12,089,344 B2
(45) Date of Patent: Sep. 10, 2024

(54) LAYERED DEVICE FOR PRESSURE TREATMENT AND METHOD

(71) Applicant: Canatu Oy, Vantaa (FI)

(72) Inventor: Ilkka Varjos, Espoo (FI)

(73) Assignee: CANATU OY, Vantaa (FI)

(*) Notice: Subject to any disclaimer, the term of this patent is extended or adjusted under 35 U.S.C. 154(b) by 215 days.

(21) Appl. No.: 17/642,865

(22) PCT Filed: Sep. 23, 2020

(86) PCT No.: PCT/FI2020/050619
§ 371 (c)(1),
(2) Date: Mar. 14, 2022

(87) PCT Pub. No.: WO2021/058865
PCT Pub. Date: Apr. 1, 2021

(65) Prior Publication Data
US 2022/0386474 A1 Dec. 1, 2022

(30) Foreign Application Priority Data
Sep. 23, 2019 (FI) .................. 20195798

(51) Int. Cl.
*B32B 7/12* (2006.01)
*B32B 27/08* (2006.01)
(Continued)

(52) U.S. Cl.
CPC ............. *H05K 3/22* (2013.01); *B32B 7/12* (2013.01); *B32B 27/08* (2013.01); *B32B 27/281* (2013.01);
(Continued)

(58) Field of Classification Search
CPC ....... B32B 7/12; B32B 27/304; B32B 27/308; B32B 27/36; B32B 27/365
See application file for complete search history.

(56) References Cited

U.S. PATENT DOCUMENTS 4,607,147 A 8/1986 Ono
2010/0053534 A1 3/2010 Hsieh
(Continued)

FOREIGN PATENT DOCUMENTS

CN 102017821 A 4/2011
CN 103324321 A 9/2013
(Continued)

OTHER PUBLICATIONS

International Search Report for PCT/FI2020/050619, prepared by the European Patent Office, mailing date Mar. 10, 2021, 5 pages.
(Continued)

*Primary Examiner* — Elizabeth E Mulvaney
(74) *Attorney, Agent, or Firm* — Brooks Kushman P.C.

(57) ABSTRACT

A layered device having two base films, a conductive pattern attached to the first base film facing the second base film and a bonding layer binding the first base film and the second base film together. The bonding layer includes an opening, and the conductive pattern having an exposed portion aligned with the opening in the bonding layer. Further disclosed is a spacer attached to the first base film and the exposed portion of the conductive pattern, wherein the spacer fills at least part of the space created by the opening in the bonding layer. Also disclosed is a method of producing a layered device.

24 Claims, 3 Drawing Sheets

(51) Int. Cl.
    *B32B 27/28*     (2006.01)
    *B32B 27/30*     (2006.01)
    *B32B 27/32*     (2006.01)
    *B32B 27/36*     (2006.01)
    *B32B 37/10*     (2006.01)
    *B32B 38/00*     (2006.01)
    *G06F 3/041*     (2006.01)
    *H05K 1/02*     (2006.01)
    *H05K 1/03*     (2006.01)
    *H05K 3/20*     (2006.01)
    *H05K 3/22*     (2006.01)
    *B32B 27/38*     (2006.01)
    *B32B 27/40*     (2006.01)

(52) U.S. Cl.
    CPC .......... *B32B 27/304* (2013.01); *B32B 27/308* (2013.01); *B32B 27/32* (2013.01); *B32B 27/325* (2013.01); *B32B 27/36* (2013.01); *B32B 27/365* (2013.01); *B32B 37/1018* (2013.01); *B32B 38/0004* (2013.01); *B32B 38/145* (2013.01); *G06F 3/041* (2013.01); *H05K 1/0298* (2013.01); *H05K 1/0313* (2013.01); *H05K 3/20* (2013.01); *B32B 27/38* (2013.01); *B32B 27/40* (2013.01); *B32B 2250/24* (2013.01); *B32B 2250/40* (2013.01); *B32B 2255/10* (2013.01); *B32B 2255/20* (2013.01); *B32B 2270/00* (2013.01); *B32B 2307/412* (2013.01); *B32B 2309/02* (2013.01); *B32B 2323/04* (2013.01); *B32B 2323/10* (2013.01); *B32B 2327/06* (2013.01); *B32B 2333/12* (2013.01); *B32B 2367/00* (2013.01); *B32B 2369/00* (2013.01); *B32B 2379/08* (2013.01); *B32B 2457/00* (2013.01); *G06F 2203/04103* (2013.01); *H05K 2203/1105* (2013.01); *H05K 2203/1121* (2013.01)

(56) References Cited

U.S. PATENT DOCUMENTS

| | | |
|---|---|---|
| 2014/0242294 A1 | 8/2014 | Petcavich |
| 2015/0185889 A1 | 7/2015 | Nakamura |
| 2015/0279508 A1 | 10/2015 | Dorfman |
| 2017/0094800 A1 | 3/2017 | Keranen |
| 2018/0210573 A1 | 7/2018 | Hashida |

FOREIGN PATENT DOCUMENTS

| | | |
|---|---|---|
| CN | 104364744 A | 2/2015 |
| CN | 109414903 B | 9/2019 |
| KR | 20100119759 A | 11/2010 |
| WO | 2015125339 A1 | 8/2015 |
| WO | 2018234627 A1 | 12/2018 |
| WO | 2019031072 A1 | 2/2019 |

OTHER PUBLICATIONS

CN Office Action for CN 202080066726.9, mailing date Apr. 24, 2024, with English Translation.

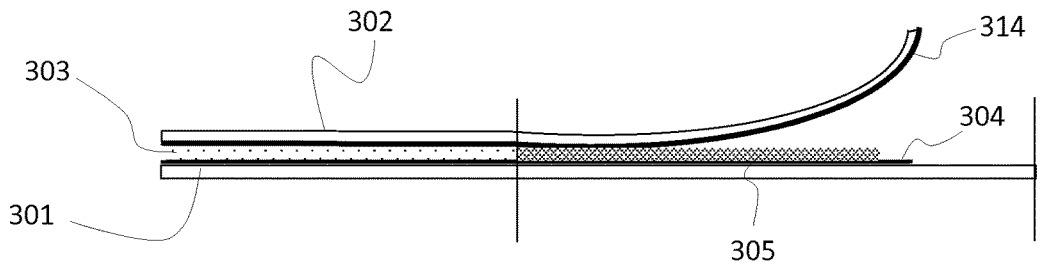

Fig. 3

Method for producing a layered electronic device

```
401 → Providing first base film and second base film
       positioned parallel to each other
         ↓
402 → Applying conductive pattern to upper surface of
       the first base film
         ↓
403 → Printing spacer on the first base film and portion of
       the conductive pattern
         ↓
404 → Preparing bonding layer by cutting into shape
         ↓
405 → Placing bonding layer between the first and second
       base films
         ↓
406 → Pressure-treating resulting layered structure
```

Fig. 4

LAYERED DEVICE FOR PRESSURE TREATMENT AND METHOD

CROSS-REFERENCE TO RELATED APPLICATION

This application is the U.S. national phase of PCT Application No. PCT/FI2020/050619 filed on Sep. 23, 2020, which claims priority to FI Patent Application No. 20195798 filed on Sep. 23, 2019, the disclosures of which are incorporated in their entirety by reference herein.

TECHNICAL FIELD

The present application relates to the field of layered devices used in electronics. The application further relates to methods for producing layered devices.

BACKGROUND

Pressure-treatment techniques are used in manufacture of layered devices to create sealed and thin electronic devices and possibly form them onto a surface. These techniques include thermoforming, vacuum forming, lamination and many others involving the use of heat and pressure. In pressure-treatment, parts of a device which are brittle or positioned in exposed areas may be prone to damage from the pressure applied to the structure from opposite sides.

SUMMARY

The device according to the present invention is characterized by what is presented in claim 1.

The method is characterized by what is presented in claim 19.

The term "comprising" is used in this specification to mean including the feature(s) or act(s) followed thereafter, without excluding the presence of one or more additional features or acts.

It will further be understood that reference to "an" item refers to one or more of those items.

The expressions "film" and "layer" should be understood in this specification, unless otherwise stated, as referring to a structure having its lateral dimensions substantially larger than its thickness. In that sense, a film may be considered as being a "thin" structure.

According to a first aspect of the invention, a device is provided. The device may be a layered device, a layered electronic device, a laminated device, a laminated electronic device or any other suitable device comprising an electrical circuit. The device comprises a first base film and a second base film positioned parallel to the first base film at a predetermined distance. The first and second base films each comprise two surfaces, one of which is facing a corresponding surface of the other film. The first and second base films may be a first and a second substrate. The words "first" and "second" are used interchangeably and are simply used for clarity, for example the first and second base films may each be a bottom or top film if the device is positioned horizontally, etc.

The device comprises a conductive pattern attached to a surface of the first base film facing the second base film. The device also comprises a bonding layer filling at least partially the space between the first base film and the second base film, enclosing a portion of the conductive pattern and binding the first base film and the second base film together. The bonding layer connects at least partially the first and second base films to each other. The connection may be adhesion or any other type of bonding, such as a non-adhesive layer which bonds the first and second base films together after forming or heat treatment.

The bonding layer comprises an opening, and the conductive pattern comprises at least one exposed portion aligned with the opening in the bonding layer. The device further comprises a spacer attached to the first base film and the exposed portion of the conductive pattern, wherein the spacer fills at least part of the space created by the opening in the bonding layer.

The opening in the bonding layer and the exposed portion of the conductive pattern may be needed in various electronic applications to provide access to the conductive pattern, and possibly connection point. The device according to the first aspect is arranged to be subjected to thermoforming, vacuum forming, lamination or any other pressure-based, and possibly temperature-based manufacturing process. In these processes, if the pressure is applied evenly across the first and second base films, the exposed portion of the conductive pattern which is not covered by the bonding layer due to an opening may be exposed to damage, due to the force with which the first and second base films are pressed into each other, and due to brittleness of the conductive pattern. The device according to the first aspect comprises at least one spacer filling at least part of the space created by the opening, thereby providing protection against damage and breaking of the conductive pattern during high-pressure treatment.

In an embodiment, at least an end of the exposed portion of the conductive pattern in the device according to the first aspect is at loose and detached from the first base film, for example if the opening in the bonding layer is adjacent with a border of one of the first and/or second base films, so that the exposed portion is at an edge of the conductive pattern and therefore only secured by the bonding layer and attached to the first base film at one side. This can provide easier access to the exposed portion of the conductive pattern, e.g. for providing a connection point.

According to an embodiment, the spacer comprises two or more structures rigidly fixed to the first base film and the exposed portion of the conductive pattern, and wherein the structures are positioned adjacent to each other at a predetermined distance.

The structures according to the embodiment may comprise pillars, spacer dots or any other structures suitable for preventing excessive pressure on the conductive pattern during further manufacture. The two or more structures may also be positioned adjacent to the elements of the conductive pattern for better protection. The structures may be aligned in height so that their upper sides are positioned at substantially the same level, creating a discontinuous surface for the upper layer to be pressed against, thereby evenly protecting the conductive pattern from damage.

In an embodiment, the spacer structures comprise material selected from: ultraviolet cross-linking polymer inks, thermally cross-linkable polymer inks and thermosetting inks. These materials provide a combination of rigidness, flexibility and temperature resistance necessary for protection during thermoforming. The materials may also be ultra-violet cured.

In alternative embodiments, the spacer may have a solid shape that is not separated into separate structures.

According to an embodiment, the spacer comprises a peel-off coating that evenly fills at least part of the space created by the opening in the bonding layer.

The peel-off coating can provide protection for the conductive pattern and be useful in applications where the conductive pattern has one or more loose ends after thermoforming, so that the peel-off coating can be removed (peeled off). However, the pillars or other spacer structures from previous embodiments that are rigidly fixed to the first base film may be more durable and provide higher pressure and temperature resistance.

The peel-off coating may comprise a polymer matrix, ultraviolet or thermally cross-linkable polymer. The peel-off coating may be cured by temperature or ultra-violet radiation after it is printed and before the device is treated and the coating is peeled off. In addition to, or as an alternative to cross-linking, the peel-off coating may also comprise solvent- or water-based solutions, wherein the solvent or water is evaporated in a drying process following the printing process.

In further embodiments, the spacer may comprise a combination of two or more separate spacer structures rigidly fixed to the first base film positioned adjacent to each other and a peel-off coating.

In an embodiment, the first base film and the second base film are non-conductive. This can provide insulation of the conductive pattern positioned between them. The non-conductive first base film and the second base film may comprise a material selected from a group of: polyethylene terephthalate, polycarbonate, polymethyl methacrylate, cyclic olefin copolymer, triacetate, cyclic Olefin Copolymer, poly(vinyl chloride), poly(ethylene 2,6-naphthalate), polyimide, polypropylene, polyethylene, and any combination thereof.

In an embodiment, the first base film and/or the second base film are transparent. The expression "transparent" should be understood in this specification, unless otherwise stated, as referring to optical transparency of the base films or the parts and materials thereof in the relevant wavelength range at issue. Transparent material or structure refers to a material or structure allowing light, or generally electromagnetic radiation, at such relevant wavelength to propagate through such material or structure. The relevant wavelength range may depend on the application where the laminated transparent film is to be used. In one embodiment, the relevant wavelength range is the visible wavelength range of approximately 390 to about 700 nanometers. In one embodiment, the preferred wavelength range is 850 to 1550 nanometers.

Furthermore, the transparency of the base films or the parts thereof primarily refers to the transparency in the thickness direction of the laminated film or the parts thereof so that in order to be "transparent", sufficient portion of light energy incident on the base film or a part thereof shall propagate through it in the thickness direction. This portion may depend on the application in which the base film is to be used. In one embodiment, the transmittance of the first and/or second base film or the parts thereof is 20-99.99% of the energy of light incident perpendicularly on the laminated film, at a location where the transparent conductor material is present. In one embodiment, said transmittance is 20% or higher, or 30% or higher, or 40% or higher, or 50% or higher, or 60% or higher, or 70% or higher, or 80% or higher, % or higher. The transmittance may be measured according to standard JIS-K7361, ASTM D1003.

In an embodiment, the conductive pattern comprises a network of conductive high aspect ratio molecular structures (HARM-structures).

A conductive "HARM structure" refers to electrically conductive "nanostructures", i.e. structures with one or more characteristic dimensions in nanometer scale, i.e. less or equal than about 100 nanometers. "High aspect ratio" refers to dimensions of the conductive structures in two perpendicular directions being in significantly different magnitudes of order. For example, a nanostructure may have a length which is tens or hundreds of times higher than its thickness and/or width. In a HARM-structures network, a great number of said nanostructures are interconnected with each other to form a network of electrically interconnected molecules. As considered at a macroscopic scale, a HARMS network forms a solid, monolithic material in which the individual molecular structures are disoriented or non-oriented, i.e. are oriented substantially randomly, or oriented. Various types of HARMS networks can be produced in the form of thin transparent layers with reasonable resistivity.

In one embodiment, the conductive HARM-structures comprise metal nanowires, such as silver nanowires.

In one embodiment, the conductive HARM-structures network comprises carbon nanostructures. In one embodiment, the carbon nanostructures comprise carbon nanotubes, carbon nanobuds, carbon nanoribbons, or any combination thereof. In one embodiment, the carbon nanostructures comprise carbon nanobuds, i.e. carbon nanobud molecules. The carbon nanobuds or the carbon nanobud molecules, have fullerene or fullerene-like molecules covalently bonded to the side of a tubular carbon molecule. Carbon nanostructures, especially carbon nanobuds, may provide advantageous both from electrical, optical (transparency), and mechanical (robustness combined with flexibility and/or deformability) points of view.

In an embodiment, the conductive pattern comprises at least one set of conductive traces. The conductive traces can be used in a variety of layered electronic devices. In some cases, the conductive traces are especially fragile and may break easily from pressure applied through the first and second base films, which creates an additional need for a protective structure such as the spacer according to the first aspect.

In an embodiment, the device further comprises a second conductive pattern attached to a surface of the second base film facing the first base film, wherein the conductive pattern attached to the surface of the first base film facing the second base film is a first conductive pattern. This embodiment provides a device with at least two conductive patterns facing each other and attached to opposite base films. In this embodiment the spacer protects the first and second conductive patterns from damage, which can be caused by pressure applied for example in thermoforming or laminating. The spacer may also protect the conductive traces from shorting with each other.

In alternative embodiments, the second conductive pattern may be attached to an opposite side of the first base film or opposing side of the second base film.

In an embodiment, the first and second conductive patterns are aligned to be separated in the plane of the parallel first and second base films. In this embodiment the conductive patterns are brought apart so that they can be insulated from each other and not damaged during high pressure treatment. For example, in an application such as a touch sensor, the electrodes may be in different planes and not overlap.

In an embodiment, the bonding layer filling at least partially the space between the first base film and the second base film, and enclosing a portion of the conductive pattern, comprises an adhesive. The bonding layer may also comprise a bonding promoter selected from a group of: acrylic adhesive, silicon adhesive, polymer adhesive, a crosslinking polymer, epoxy adhesive, polycarbonate, a thermoplastic polyurethane (TPU) and any combination thereof.

The adhesive may be an optically clear adhesives (OCR) which is advantageous in devices that require transparent films, for example devices with displays.

In an embodiment, the bonding layer is further configured to insulate the portion of the conductive pattern which it encloses. Adhesives can serve as an insulator for the conductive patterns which removes the necessity of adding other insulating structures or bringing conductive elements apart from each other.

In an embodiment, the spacer fills at least part of the space between the exposed portion of the conductive pattern and the second base film. The spacer may also further insulate the exposed portion of the conductive pattern and replace the adhesive in the opening, without having the adhesive properties and being easily removable or allowing parts of the device to be loose or detachable.

In an embodiment, the spacer comprises mechanically rigid material able to withstand at least 5200 bars of pressure in temperatures up to 25 C. In an embodiment, the material is able to withstand the pressure in temperatures up to 180 C. These mechanically rigid materials may include UV-curable polymer matrixes, screen printable inks, water-based polymer matrixes or other suitable materials. An example of suitable materials is Nor-Cote UVS-161 for rigidly fixed spacers, and in the case of peel-off coating Kiwomask S 110, Kiwomask S 111, or Kiwomask S 150.

In an embodiment, the device comprises three or more base films attached to each other in a stack by adhesives. In this embodiment, each adjacent pair of base films may comprise a conductive pattern and a spacer in an opening of each layer of the adhesives, as described in the first aspect.

In an example embodiment, a touch sensor comprising the device of any of the previous embodiments is provided. The exposed portion of the conductive pattern comprises at least one electrode of the touch sensor. In other embodiments, touch switches, touch sensors, solar panels, heating elements and other devices may advantageously incorporate the device according to the first aspect.

In one embodiment, the first or second base film has a thickness of 1-5000 μm, or 10-2000 μm, or 30 to 500 μm, or 50-300 μm. This preferable size is suited for most applications of the device, such as touch switches, touch sensors, heating elements and solar cells. However, the base films may also be thicker in some applications. The first base film and the second base film may have the same or different thicknesses.

In a second aspect, a method for producing a layered electronic device is provided. The method comprises providing a first base film and a second base film positioned parallel to the first base film at a predetermined distance, applying a conductive pattern to a surface of the first base film facing the second base film, printing a spacer on the first base film and a portion of the conductive pattern, preparing a bonding layer by cutting it to a predetermined shape comprising an opening, placing the bonding layer between the first base film and the second base film to fill at least partially the space between the first base film and the second base film, and enclosing a portion of the conductive pattern, such that the opening in the bonding layer is aligned with the location of the spacer printed on the first base film and the portion of the conductive pattern, and treating the resulting layered structure at a predetermined pressure and temperature. The bonding layer may comprise an adhesive or a thermoplastic film which can melt at a predetermined temperature.

The bonding layer may be placed between the first and second base films by various means. In one embodiment, the bonding layer is printed in a pattern onto the first base film and the conductive pattern. The pattern of the printed bonding layer may include one or more openings, therefore in this embodiment the operations of preparing the bonding layer and placing it between the films can be done in one step.

The operations prior to treating the resulting layered structures can provide a layered device as described in any of the embodiments of the first aspect. Treating the resulting layered structure finalizes the production of a layered device. According to embodiments, treating may include forming, thermoforming, laminating or other techniques of pressure-treatment. The benefits of the method include efficiency of production and an improved resulting layered structure which is protected during the final pressure-treatment step, among others.

In an embodiment, the conductive pattern is applied to a surface of the first base film facing the second base film by depositing a conductive material and etching the conductive material to create a pattern. In an embodiment, conductive pattern is also applied to a surface of the second base film. In an embodiment, the conductive pattern is formed in the conductive material after having deposited the conductive material on the first base film and/or on the second base film.

In an embodiment, depending on the material of the conductive pattern, various procedures existing in the art may be used for depositing the conductive material. For example, the conductive material may be deposited by sputtering in vacuum conditions, printing, electroplating, depositing from gas phase, in a force field, depositing from a solution using spray coating or spin drying, or by any other appropriate method.

For the patterning, various processes may be used. In one embodiment, a laser process, an etching process, direct printing, a mechanical process, a burning process, or any combination thereof, is used for the patterning. In one embodiment, the laser process is laser ablation. In one embodiment, the etching process is a photolithographic process. In an embodiment, the pattern is formed simultaneously or after the conductive material is deposited depositing on the first and/or on the second base film.

According to an embodiment, the operations of applying a conductive pattern and printing a spacer are performed on the second base film prior to adding the bonding layer between the first base film and the second base film. The conductive pattern on the second base film may be facing the first film or applied on the opposite surface of the second base film. The operations of the method may also be carried out multiple times to create a laminated or multilayered device comprising spacers between base films to reinforce the exposed portions of the conductive pattern during pressure-treatment.

In an embodiment, the pressure-treatment of the resulting layered structure comprises thermoforming at a temperature between 130-200 C.

In an embodiment, the pressure-treatment of the resulting layered structure comprises laminating in a vacuum at a temperature between 50-300 C, or at a temperature between 150-300 C, or at a temperature between 170-190 C. According to further embodiments, the pressure-treatment may comprise a combination of techniques such as thermoforming, laminating and others.

In an embodiment, the method further comprises creating at least one loose end of the conductive pattern by die-cutting or laser cutting a portion of the conductive pattern that corresponds to the portion of the conductive pattern to which the spacer is printed.

Creating a loose or detachable end of the conductive pattern prior to treating can provide easier access to the exposed portion of the conductive pattern, for example for providing a connection point to electrodes if the conductive pattern comprises electrodes.

In an embodiment, the method further comprises cooling the device after pressure-treating. The cooling operation may be required for securing a shape e.g. after thermoforming or any other process.

It will be understood that the benefits and advantages described above may relate to one embodiment or may relate to several embodiments. The embodiments are not limited to those that solve any or all of the indicated problems or those that have any or all of the stated benefits and advantages.

The embodiments described hereinbefore may be used in any combination with each other. Several of the embodiments may be combined together to form a further embodiment. A method, a layered device, a use, or a touch sensitive film, to which the application is related, may comprise at least one of the embodiments described hereinbefore.

BRIEF DESCRIPTION OF THE DRAWINGS

The accompanying drawings, which are included to provide a further understanding of the layered device and the method for its production, illustrate embodiments and together with the description help to explain the principles of the above. In the drawings:

FIG. 3 schematically shows a sectional view of a flexible layered device comprising a loose conductive structure, according to an embodiment; and FIG. 4 is a block diagram of a method according to an embodiment.

DETAILED DESCRIPTION

Reference will now be made in detail to the described example embodiments, examples of which are illustrated in the accompanying drawings.

The description below discloses some embodiments in such detail that a person skilled in the art can utilize the disclosed layered device and method based on the disclosure. Not all steps of the embodiments are discussed in detail, as some of the steps can be obvious for the person skilled in the art based on this specification.

For reasons of simplicity, item numbers will be maintained in the following exemplary embodiments in the case of repeating components.

The present invention generally relates to layered electronic devices, such as touch switches, touch sensors, touch displays, heating elements, solar cells and others. In these devices, when pressure-treatment such as pressure-forming, thermoforming, lamination or any other technique is used in manufacture, it is often desired to provide electrical contact with the layered device by leaving a portion of its conductive element exposed. However, the exposed portions are prone to damage during pressure-treatment because of the force created during such process. The device according to embodiments of the present invention comprises an additional spacer element which prevents such damage and protects the exposed portion of the conductive element. The method according to an aspect provides a process for manufacturing a layered device using the spacers.

Figure 1A:
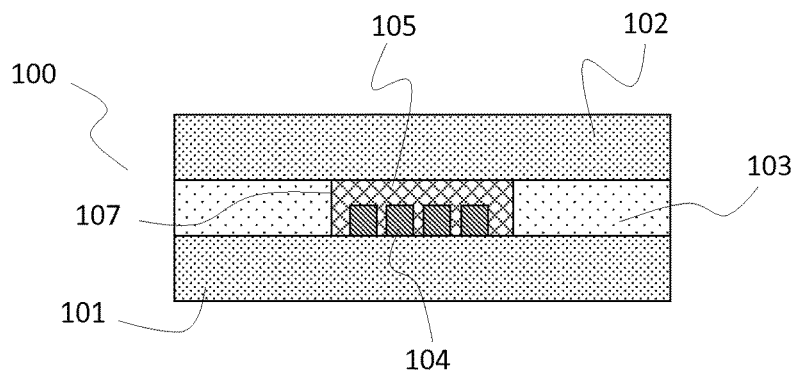
FIG. 1a schematically illustrates a sectional view of a layered device according to one embodiment.

FIG. 1a illustrates schematically a sectional view of a layered device 100 according to an example implementation. The device comprises a first base film 101, a second base film 102 positioned parallel to the first one 101, a conductive pattern 104 attached to a surface of the first base film 101 facing the second base film 102, and a bonding layer 103 between them.

The first and second base films 101, 102 may be non-conductive substrates which insulate the conductive pattern 104. The base films 101, 102 can comprise a material selected from a group of: polyethylene terephthalate, polycarbonate, polymethyl methacrylate, cyclic olefin copolymer, triacetate, cyclic Olefin Copolymer, poly(vinyl chloride), poly(ethylene 2,6-naphthalate), polyimide, polypropylene, polyethylene, and any combination thereof.

The conductive pattern 104 is illustrated schematically as a set of conductive traces, according to an implementation. Conductive traces are commonly used in layered electronics such as touch sensors. However, the conductive pattern 104 may have any other suitable arrangement of conductive elements.

The conductive pattern 104 may comprise a network of conductive high aspect ratio molecular structures (HARM-structures) and be useful in transparent films due to the advantageous properties of some HARM-structures.

The bonding layer 103 fills at least partially the space between the first base film 101 and the second base film 102, enclosing a portion of the conductive pattern 104 and binding the first base film 101 and the second base film 102 together. The bonding layer 103 may comprise an adhesive. The bonding layer 103 may also comprise a bonding promoter selected from a group of: acrylic adhesive, silicon adhesive, polymer adhesive, a crosslinking polymer, epoxy adhesive, polycarbonate, a thermoplastic polyurethane (TPU) and any combination thereof. The adhesive may be an optically clear adhesives (OCR) which is useful in devices that require transparent films, for example devices with displays.

The bonding layer 103 comprises an opening 107, which may be at the side as shown with the side view of FIG. 1a, or inside the perimeter of the device 100. In an implementation, the opening 107 is arranged at the perimeter of the bonding layer 103 to provide an access point.

The conductive pattern 104 comprises at least one exposed portion aligned with the opening 107 in the bonding layer 103. The sectional view of FIGS. 1a-1d is oriented so that the opening 107 and exposed portion of the conductive pattern 104 face the viewer.

This structure provides an access point for the conductive pattern 104, however if the device 100 is subjected to pressure-forming, thermoforming, laminating or other types of pressure-treatment, there is a potential for the exposed portion of the conductive pattern 104 to be damaged from the pressure. This is at least in part because of the opening 107 in the bonding layer 103 needed to provide the access. The opening 107 exposes a portion of the conductive pattern

104 and removes support which the bonding layer 103 provided elsewhere in the device 100.

Figure 1B:
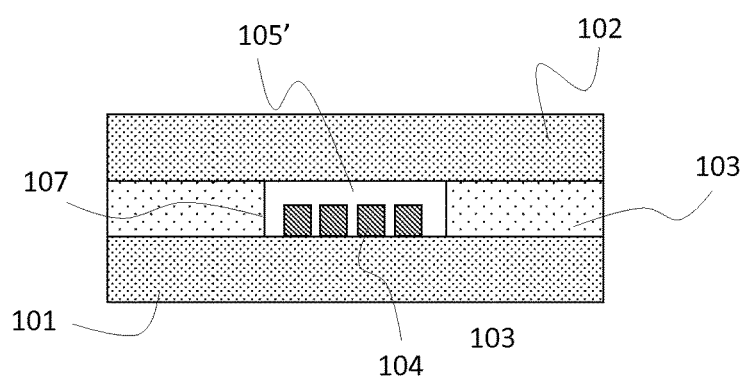
FIG. 1b is a schematic sectional view of the layered device with spacer removed, according to an embodiment.

The device 100 further comprises a spacer 105 attached to the first base film 101 and the exposed portion of the conductive pattern 104, wherein the spacer 105 fills at least part of the space created by the opening 107 in the bonding layer 103. FIGS. 1a-1b illustrate an implementation wherein the spacer 105 comprises a peel-off coating 105 that evenly fills at least part of the space created by the opening 107 in the bonding layer 103. The peel-off coating 105 may comprise a polymer matrix, ultraviolet or thermally cross-linkable polymer, or a solvent-based or water-based solution.

The peel-off coating 105 can have a temporary use and be removed, for example peeled off or partially evaporated if it comprises solvent- or water-based solutions. It can be removed after the device manufacture is completed by pressure-treatment in a predetermined temperature. The pressure-treatment may comprise thermoforming at a temperature between 130 and 200 C, or laminating in a vacuum at a temperature between 170 and 190 C, or any other suitable pressure-based treatment which seals and/or forms layers of the device together and onto a surface. FIG. 1b shows the device 100 after thermoforming with the peel-off coating 105 removed, instead leaving a space 105' which can be filled later with a filler or remain empty.

Figure 1C:
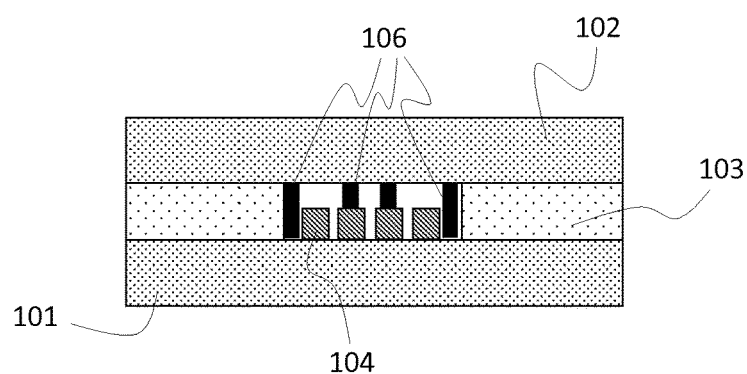
FIG. 1c is a schematic sectional view of the layered device with spacer structures, according to an embodiment.
Figure 1D:
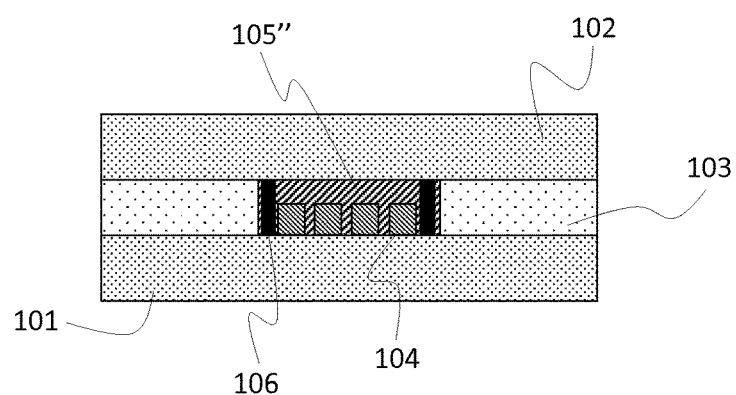
FIG. 1d is a schematic sectional view of the layered device with combined spacers, according to an embodiment.

FIGS. 1c-1d illustrate an implementation wherein the spacer comprises two or more structures 106 rigidly fixed to the first base film 101 and the exposed portion of the conductive pattern 104. These structures 106 are positioned adjacent to each other at a predetermined distance.

In the implementation shown on FIG. 1c, the structures 106 are also aligned in height so that their upper surfaces lie substantially in the same plane as the lower surface of the second base film 102. The structures 106 shown in the example implementation of FIG. 1c are shaped as pillars, however any other suitable shape may be used for the spacer structures 106.

The rigidly fixed structures 106 can comprise material selected from: ultraviolet cross-linking polymer inks, thermally cross-linkable polymer inks and thermosetting inks. These materials can be rigid enough to withstand at least 5200 bars of pressure in temperatures up to 250 C, while protecting the conductive pattern 104 from damage during pressure-treatment.

FIG. 1d illustrates that the layered device 100 may comprise a combination of rigidly fixed pillars or spacer structures 106 and a peel-off additional coating 105". In some implementations, solid singular structures may be rigidly fixed to the first base film 101, if the protection these structures provide against pressure is sufficient.

Figure 2A:
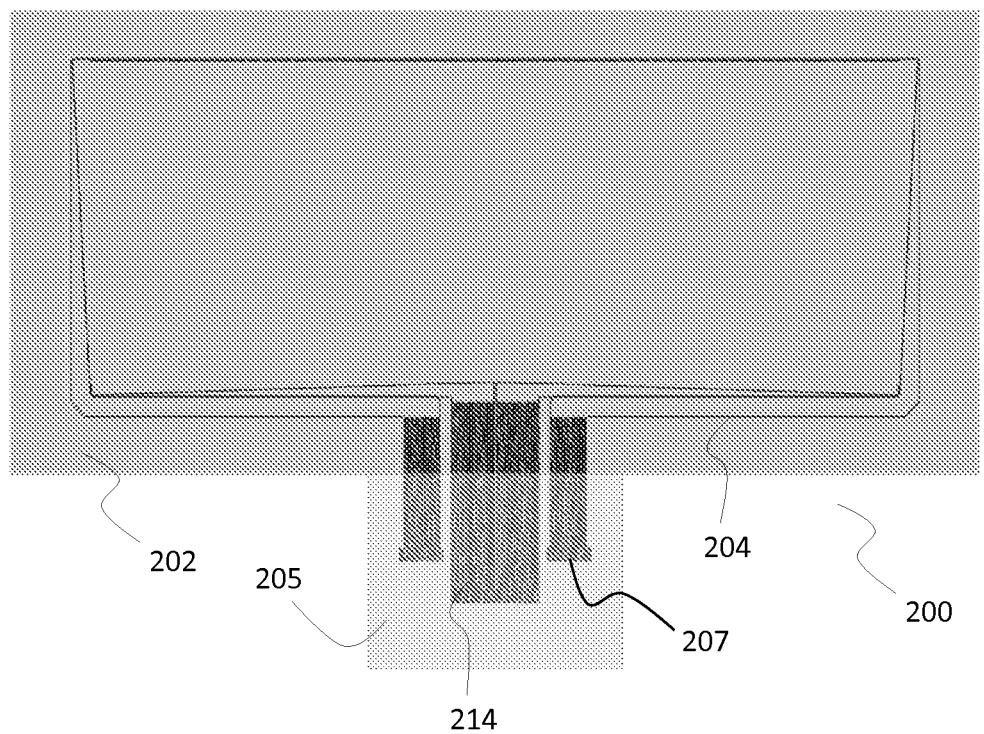
FIG. 2a schematically illustrates a top view of a device with peel-off spacer, according to one embodiment.
Figure 2B:
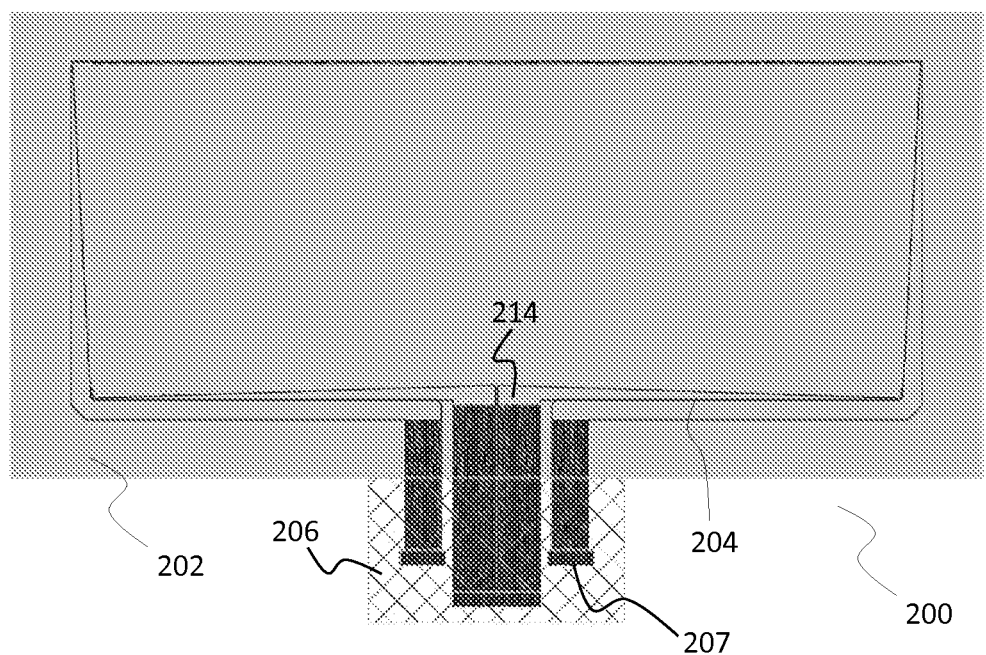
FIG. 2b is a schematic top view of a device with spacer structures, according to an embodiment.

FIG. 2a is a schematic top view of a layered device 200 with a peel-off coating 206, and FIG. 2b is a schematic top view of a layered device 200 with rigidly fixed structures 206. The devices 200 shown in FIGS. 2a-2b may be one example of the devices 100 shown in FIGS. 1a-1d, accordingly. On FIG. 2b, the rigidly fixed structures are illustrated only schematically and may be positioned anywhere within the cross-dashed area 206.

In FIGS. 2a-2b the conductive pattern 204 is shown to extend into the device, as it would for example in a touch sensor implementation. The conductive pattern 204 comprises an exposed portion with an exposed end portion 207. The end portion 207 or the whole exposed portion of the conductive pattern 204 can be made loose and detached from the first base film (not seen in FIGS. 2a-2b). The second base film 202 is illustrated as the top film in the device 200. The first and/or the second 202 base films can be transparent.

In addition to the first conductive pattern 204 attached to the first base film, illustrated in FIGS. 2a-2b as the outer part of the circuitry and the two pins positioned on the outside, device 200 can also comprise a second conductive pattern 214 (or any number thereof). The second conductive pattern 214 is attached to the second base film 202 at a surface facing the first base film. Although this is not visible in FIGS. 2a-2b, the second conductive pattern 214 is attached to the inward facing surface of the second upper base film 202 according to this implementation. The first and second conductive patterns 204, 214 in this implementation are aligned to be separated in the plane of the parallel first and second 202 base films. This way the conductive patterns 204, 214 are arranged to avoid contact with each other during pressure treatment.

FIG. 3 is a schematic side view of an example layered device comprising two conductive patterns 304, 314 attached to the first base film 301 and the second base film 302, respectively. The device comprises a non-conductive bonding layer 303 insulating the conductive patterns 304, 314 and filling the space between the first and second base films 301, 302.

The device further comprises an opening in the adhesive layer 303 which is marked by the vertical lines on FIG. 3. The device also comprises a spacer 305 positioned between the conductive layers 304, 314 in place of the adhesive in the opening. The exposed portion of the conductive pattern 314 is made loose and detached from the first base film for easier external access (on the fight in FIG. 3). In FIG. 3 at least the material of the second base film 302 allows it to be flexible.

FIG. 4 is a flow chart of a method for producing a layered electronic device according to an aspect. The method comprises providing 401 a first base film and a second base film positioned parallel to each other. The base films may be provided in a chamber or reactor for further assembly. The method further comprises applying 402 a conductive pattern to an upper surface of the first base film and printing 403 a spacer on the first base film and portion of the conductive pattern. The method then includes forming 404 a bonding layer filling the space between the first and second base films.

Method also includes creating 405 an opening in bonding layer aligned with the spacer, for example by cutting it to a predetermined shape, such that the opening is aligned with the location of the spacer printed on the first base film and the portion of the conductive pattern.

Method is finished by pressure-treating 406 the resulting layered structure at a predetermined temperature. The pressure-treatment can be provided by any appropriate means and involves applying pressure to one of, or both the base films. In an implementation, the pressure-treatment also includes treating the resulting layered structure with UV crosslinking. In some examples, the pressure-treatment 406 of the resulting layered structure may comprise thermoforming at a temperature between 130-200 C, or any other suitable technique such as lamination and vacuum forming.

The operations prior to treating the resulting layered structures can provide a layered device as described in relation to any of the layered devices shown in FIGS. 1a-3. Treating the resulting layered structure finalizes the production of a layered device. According to some implementations, treating may include forming, thermoforming, laminating or other techniques of pressure-treatment. The benefits of the method include efficiency of production and an improved resulting layered structure which is protected during the final pressure-treatment step, among others.

The conductive pattern may be applied to a surface of the first base film facing the second base film by depositing a conductive material and etching the conductive material to create a pattern. A second conductive pattern can also be applied to a surface of the second base film.

The operations of applying 402 a conductive pattern and printing 403 a spacer can be performed on the second base film prior to forming 404 the bonding layer between the first base film and the second base film. The conductive pattern on the second base film may be facing the first film or applied on the opposite surface of the second base film. The operations of the method may also be carried out multiple times to create a laminated or multilayered device comprising spacers between base films to reinforce the exposed portions of the conductive pattern during pressure-treatment.

The method may further comprise creating at least one loose end of the conductive pattern by die-cutting or laser cutting a portion of the conductive pattern that corresponds to the portion of the conductive pattern to which the spacer is printed.

Creating a loose or detachable end of the conductive pattern prior to treating 406 can provide easier access to the exposed portion of the conductive pattern, for example for providing a connection point to electrodes if the conductive pattern comprises electrodes.

After pressure-treating 406, the method may also comprise cooling off the device (not shown on FIG. 4). The cooling operation may be required for securing a shape e.g. after thermoforming or any other process.

As it is clear to a person skilled in the art, the invention is not limited to the examples and implementations described above, but the implementations can freely vary within the scope of the claims.

The invention claimed is:

1. A layered device, comprising
a first base film,
a second base film positioned parallel to the first base film at a predetermined distance,
a conductive pattern attached to a surface of the first base film facing the second base film,
a bonding layer filling at least partially the space between the first base film and the second base film, enclosing a portion of the conductive pattern and binding the first base film and the second base film together,
wherein
the bonding layer comprises an opening,
the conductive pattern comprises at least one exposed portion aligned with the opening in the bonding layer, wherein at least an end portion of the exposed portion of the conductive pattern is loose and detached from the first base film, and
the device further comprises a spacer attached to the first base film and the exposed portion of the conductive pattern, wherein the spacer fills at least part of the space created by the opening in the bonding layer.

2. The device of claim 1, wherein the spacer comprises two or more structures rigidly fixed to the first base film and the exposed portion of the conductive pattern, and wherein the structures are positioned adjacent to each other at a predetermined distance.

3. The device of claim 2, wherein the structures comprise material selected from: ultraviolet cross-linking polymer inks, thermally cross-linkable polymer inks and thermosetting inks.

4. A layered device, comprising
a first base film,
a second base film positioned parallel to the first base film at a predetermined distance,
a conductive pattern attached to a surface of the first base film facing the second base film,
a bonding layer filling at least partially the space between the first base film and the second base film, enclosing a portion of the conductive pattern and binding the first base film and the second base film together,
wherein
the bonding layer comprises an opening,
the conductive pattern comprises at least one exposed portion aligned with the opening in the bonding layer, wherein at least an end portion of the exposed portion of the conductive pattern is loose and detached from the first base film, and
the device further comprises a spacer attached to the first base film and the exposed portion of the conductive pattern, wherein the spacer fills at least part of the space created by the opening in the bonding layer;
wherein the spacer comprises a peel-off coating that evenly fills at least part of the space created by the opening in the bonding layer.

5. The device of claim 4, wherein the peel-off coating comprises a polymer matrix, ultraviolet or thermally cross-linkable polymer, or a solvent-based or water-based solution.

6. The device of claim 1, wherein the first base film and the second base film are non-conductive.

7. The device of claim 6, wherein the first base film and the second base film comprise a material selected from a group of: polyethylene terephthalate, polycarbonate, polymethyl methacrylate, cyclic olefin copolymer, triacetate, cyclic Olefin Copolymer, poly(vinyl chloride), poly(ethylene 2,6-naphthalate), polyimide, polypropylene, polyethylene, and any combination thereof.

8. The device of claim 1, wherein the first base film and/or the second base film are transparent.

9. The device of claim 1, wherein the conductive pattern comprises a network of conductive high aspect ratio molecular structures.

10. The device of claim 1, wherein the conductive pattern comprises at least one set of conductive traces.

11. The device of claim 1, comprising a second conductive pattern attached to a surface of the second base film facing the first base film, wherein the conductive pattern attached to the surface of the first base film facing the second base film is a first conductive pattern.

12. The device of claim 11, wherein the first and second conductive patterns are aligned to be separated in the plane of the parallel first and second base films.

13. The device of claim 1, wherein the bonding layer filling at least partially the space between the first base film and the second base film, and enclosing a portion of the conductive pattern, comprises an optically clear adhesive.

14. The device of claim 1, wherein the bonding layer is further configured to insulate the portion of the conductive pattern which it encloses.

15. The device of claim 1, wherein the spacer fills at least part of the space between the exposed portion of the conductive pattern and the second base film.

16. The device of claim 1, wherein the spacer comprises mechanically rigid material able to withstand at least 5200 bars of pressure in temperatures up to 250 C.

17. A touch sensor comprising the device of claim 1, wherein the exposed portion of the conductive pattern comprises at least one electrode of the touch sensor.

18. A method for producing a layered electronic device, comprising
providing a first base film and a second base film positioned parallel to the first base film at a predetermined distance,
applying a conductive pattern to a surface of the first base film facing the second base film,
printing a spacer on the first base film and a portion of the conductive pattern,
preparing a bonding layer by cutting it to a predetermined shape comprising an opening,
placing the bonding layer between the first base film and the second base film to fill at least partially the space between the first base film and the second base film, and enclosing a portion of the conductive pattern, such that the opening in the bonding layer is aligned with the location of the spacer printed on the first base film and the portion of the conductive pattern, and pressure-treating the resulting layered structure at a predetermined temperature.

19. The method of claim 18, wherein the conductive pattern is applied to a surface of the first base film facing the second base film by depositing a conductive material and etching the conductive material to create a pattern.

20. The method of claim 18, wherein the operations of applying a conductive pattern and printing a spacer are performed on the second base film prior to adding the adhesive between the first base film and the second base film.

21. The method of claim 18, wherein the pressure-treatment of the resulting layered structure comprises thermoforming at a temperature between 130 and 200 C.

22. The method of claim 18, wherein the pressure-treatment of the resulting layered structure comprises laminating in a vacuum at a temperature between 50-300 C, or at a temperature between 150-300 C, or at a temperature between 170-190 C.

23. The method of claim 18, further comprising creating at least one loose end of the conductive pattern by die-cutting or laser cutting a portion of the conductive pattern that corresponds to the portion of the conductive pattern to which the spacer is printed.

24. The method of claim 18, further comprising cooling the device after pressure-treating.

\* \* \* \* \*